United States Patent [19]

Bloch

[11] 4,312,071
[45] Jan. 19, 1982

[54] DIGITAL CODE ERROR DETECTION AND ALERTING SYSTEM

[75] Inventor: Ramon Bloch, Yonkers, N.Y.

[73] Assignee: Safe Flight Instrument Corporation, White Plains, N.Y.

[21] Appl. No.: 99,903

[22] Filed: Dec. 3, 1979

[51] Int. Cl.³ ............................................. G06F 11/12
[52] U.S. Cl. .................................................. 371/57
[58] Field of Search .......................... 371/57; 364/435; 335/92 GD

[56] References Cited

U.S. PATENT DOCUMENTS

| | | | |
|---|---|---|---|
| 3,860,908 | 1/1975 | Stratton | 371/57 X |
| 4,059,749 | 11/1977 | Feilchenfeld | 371/57 |
| 4,173,752 | 11/1979 | Yamanaka | 371/57 X |

*Primary Examiner*—David H. Malzahn
*Attorney, Agent, or Firm*—Edward A. Sokolski

[57] ABSTRACT

A digitally coded output is provided from a sensor, such as an aircraft angle of attack sensor. Groups of unused words from the complete unit distance table are omitted between groups of words that are selected to be used in the code, these unused words being "illegal" words indicating an error if they appear in the output of the sensor. The digitally encoded output of the sensor is, in the preferred embodiment, in unit distance code, and is fed to a programmed ROM where it is converted to binary or other convenient code, this binary encoded information representing the sensor output being employed to convey the information provided thereby. The output of the sensor is also fed to a second programmed ROM which has information stored therein indicative of which of the code words are "illegal". Whenever an illegal word is fed to this second programmed ROM, it generates a digital output indicating an error. This output is used to drive an alerting device to provide a warning to the operator that there is an error in the system's output. A third ROM is used to check the pairty of the code converting ROM to ensure detection of a ROM error.

8 Claims, 3 Drawing Figures

DIGITAL CODE ERROR DETECTION AND ALERTING SYSTEM

This invention relates to digital code error detection and alerting systems, and more particularly to such a system suitable for use in conjunction with a sensor such as an angle of attack sensor employed on a vehicle such as an aircraft.

In modern aircraft systems, flight parameters such as angle of attack often are generated in digitally encoded form by means of transducers which generate their output signals either optically or electrically. Position information such as is generated by an angle of attack vane requires the use of a unit distance code in its processing rather than a binary code in order to avoid ambiguity during code transitions between adjacent words. A unit distance code which is often employed in the sensor device is Gray Code, the Gray coded information being converted to binary form for processing. Generally, parity checks are employed for error detection at the binary output. However, this only checks the operation of the converting system and not the accuracy of the raw data as it is supplied from the sensor.

The present invention overcomes this shortcoming of the prior art by providing means for detecting errors which may appear in the output of the sensor. This end result is achieved by eliminating certain groups of "illegal" words from all the possible words of the complete unit distance table. Typically, as is the situation in the illustrative embodiment, out of a total of 1,024 words available in a ten-bit complete unit distance table, only 601 words are used, the unused or "illegal" words being interspersed in groups between the legal words. In the illustrative embodiment, a code map has been drawn on the unit distance table to select a path that generates a unit-distance code which has legal words interspersed with illegal words. Thus, if errors appear in the output of the sensor, there is a high probability that these errors will result in the appearance of "illegal" words in the sensor output which can be appropriately detected and an alerting signal provided to the operator to warn of this error.

In implementing the preferred embodiment of the invention, a programmed ROM is employed to which the unit distance coded sensor output signals are fed, this ROM being programmed so that when it is addressed by an "illegal" word it will produce a predetermined output signal. Whenever such predetermined output signal appears, it actuates an alerting device which provides a warning signal to the operator.

It is therefore an object of this invention to provide an improved system for detecting and warning of errors in the output of a sensor employing a unit distance code.

It is a further object of this invention to improve the reliability of operation of aircraft sensors employing unit distance codes.

Other objects of the invention will become apparent as the description proceeds in connection with the accompanying drawings of which:

Figure 1:
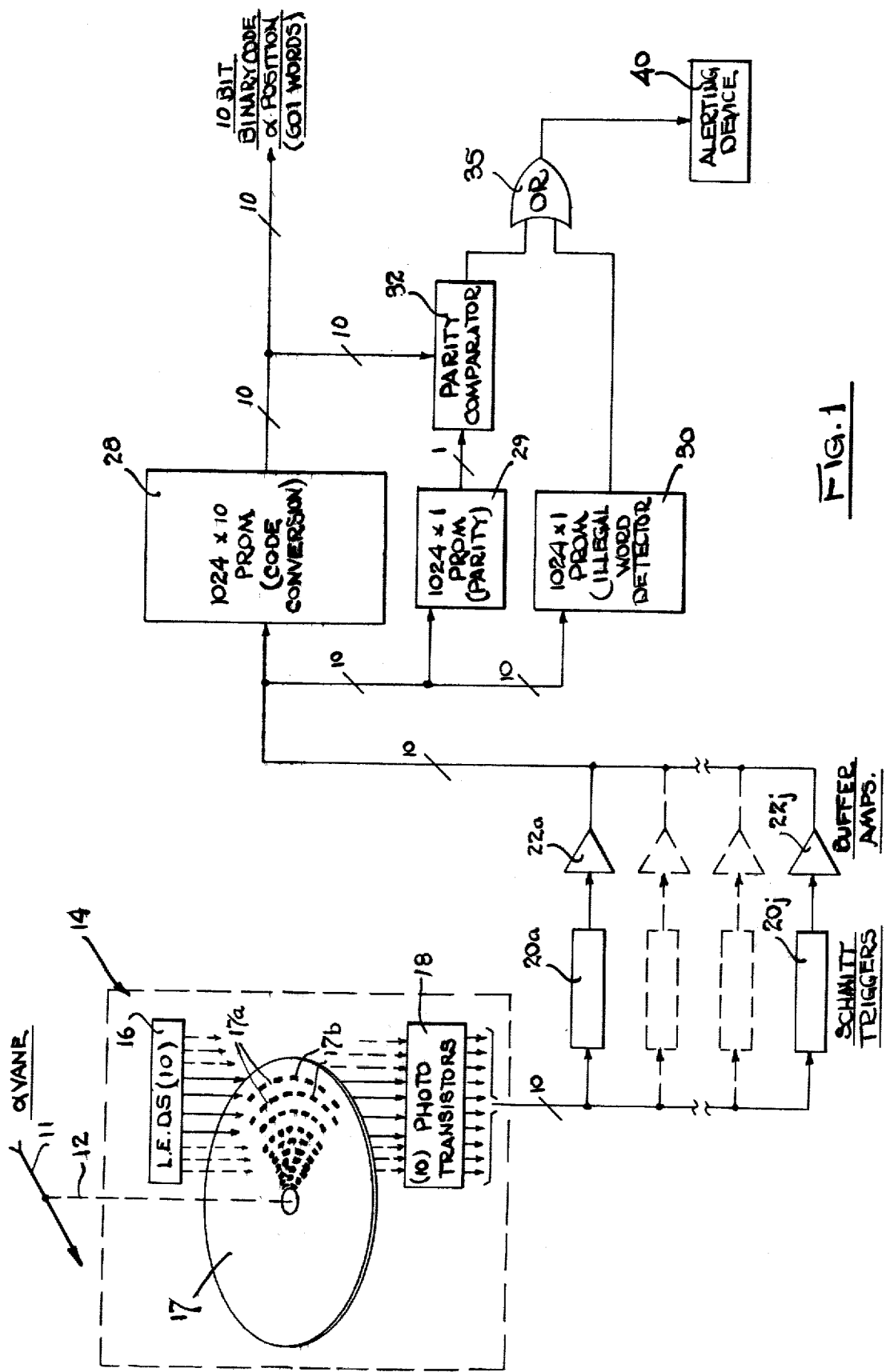
FIG. 1 is a functional block diagram illustrating a preferred embodiment of the invention.

Referring now to FIG. 1, a preferred embodiment of the invention is illustrated. Angle of attack vane 11 is fixedly attached to the rotatable input shaft 12 of digital encoder transducer 14. Transducer 14 has a bank of light-emitting diodes (LED's) 16 which are positioned on one side of coding disc 17 and a corresponding bank of photo-transistors 18 positioned opposite light-emitting diodes 16 on the opposite side of coding disc 17. Coding disc 17 is fabricated of a transparent material such as glass and has alternate adjacent transparent and opaque portions 17a and 17b which are arranged to represent the encoded information of the particular code employed. There is a light-emitting diode and a photo-transistor for each of the bits of the code employed, there being 10 bits in the illustrative example. Each LED of bank 16 is positioned opposite a corresponding photo-transistor of bank 18, such that when the coded clear (transparent) portions 17a appear between portions of banks 16 and 18, light will pass through the disc in accordance with the coding pattern from certain of the light-emitting diodes to actuate corresponding ones of the photo-transistors. While LED's (light-emitting diodes) have been shown in the illustrative embodiment, any suitable light source, such as conventional lamps, may be employed in their stead. A commercially available optical encoder may be used for encoder 14, such as Model OADC-23/4/BCDQ(200)L, available from Vernitech Division of Vernitron Corp., Deer Park, New York; this encoder being modified to incorporate a code disc for the particular code employed with the present invention.

The outputs of the transistors of photo-transistor bank 18, which are a unit distance-coded representation of the angular position of angle of attack vane 11, are fed to Schmitt triggers 20a–20j. The outputs of Schmitt triggers 20a–20j are each fed to an associated buffer amplifier 22a–20j. The 10 digital binary encoded outputs of buffer amplifiers 22a–22j are fed to each of programmed ROM's 28–30. ROM 28 is programmed to convert the a 10-bit digital unit distance coded information fed thereto to a 10-bit binary code which represents the angular position of the angle of attack vane 11 with any one of 601 words.

ROM 29 is programmed to provide an output signal indicative of whether the input thereto has even or odd parity. A signal indicative of even or odd parity is fed from programmed ROM 29 to parity comparator 32 for comparison with the output of programmed ROM 28. This parity check is made to detect any one bit errors which may have been developed in programmed ROM 28. In the absence of any such error, comparator 32 will generate a "0" output.

Programmed ROM 30 is used to detect illegal words in the outputs of the sensor circuit. This ROM is programmed to detect whether or not each of the words sequentially addressed thereto is "legal" and outputs a "0" if the word is legal or a "1" if the word is "illegal". The outputs of parity comparator 32 and programmed ROM 30 are fed to OR gate 35 which in the case of "1" outputs from either the comparator or programmed ROM 30, provides a signal to alerting device 40 which causes this device to provide an alerting signal to the operator which may be in the form of a warning light, buzzer, etc. Table 1 (at the end of the specification) contains the complete unit distance table for 10 bits. This table contains all the possible different words that can be made using 10 bits. The words are arranged so that any two adjacent words are unit distance apart.

This table is similar to the one used to develop Karnaugh maps for logic optimization. The total number of words, m, in the table is equal to $m=2^l$, where l is the length in bits of the word, i.e., $m=2^{10}=1024$.

Referring now again to the Complete Unit Distance Table, which appears at the end of the specification and and is designated "Table 1", an illustrative example of the operation of the system of the invention will now be given for the situation where the position of the sensor is at the code word 295 represented by the code 0100001110 which has an asterisk (*) next to it on the Complete Unit Distance Table, for convenience of illustration. To facilitate illustration, the Complete Unit Distance Table has been marked with underlining to show the unit distance path followed to select the desired 601 word unit distance code (i.e., the 601 selected words are underlined and the direction of the path indicated). The listing of the resulting code is shown in the Code Table designated "Table 2". The following are the possible 10 one-digit errors for the word for 295 (0100001110). For convenience of identification, in the following list the bit in error has been underlined in each instance: 1100001110 (illegal); 0000001110 (legal); 0110001110 (illegal); 0101001110 (illegal); 0100101110 (illegal); 0100011110 (illegal); 0100000110 (illegal); 0100001010 (legal); 0100001100 (legal); 0100001111 (legal). A box has been placed around each of these possible error words in the Complete Unit Distance Table (Table 1).

As can be seen, six of these errors fall outside the path selected for the desired code and thus are "illegal", while the remaining four are inside the path selected for the desired word and are therefore "legal". In view of the fact that in actual operation the position of the angle of attack vane varies continuously, with a new code word being generated at each position, new words are constantly being generated which increases the number of words that could be detected were there a fault in the system. Hence, there is a high probability that any one-bit failure will be detected in a relatively short period of time.

To assure a proper detection of illegal words, ROM 30 gives an invalid output for any illegal word, while legal words result in a valid output.

Figure 2:
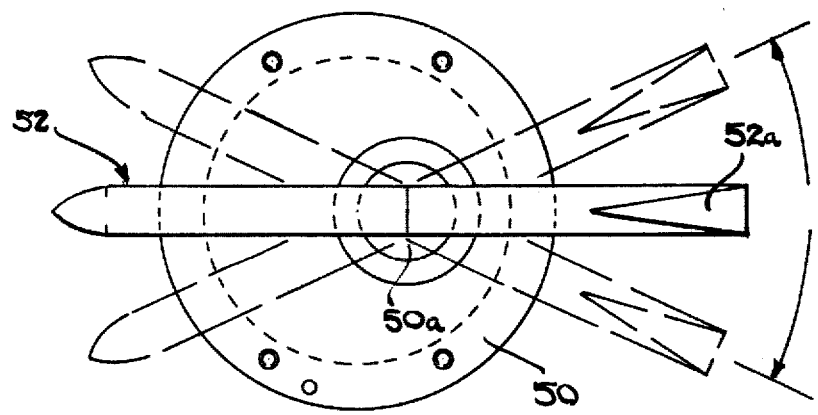
FIG. 2 is a top-plan view of an angle of attack transducer which may be employed in the system of the invention.
Figure 3:
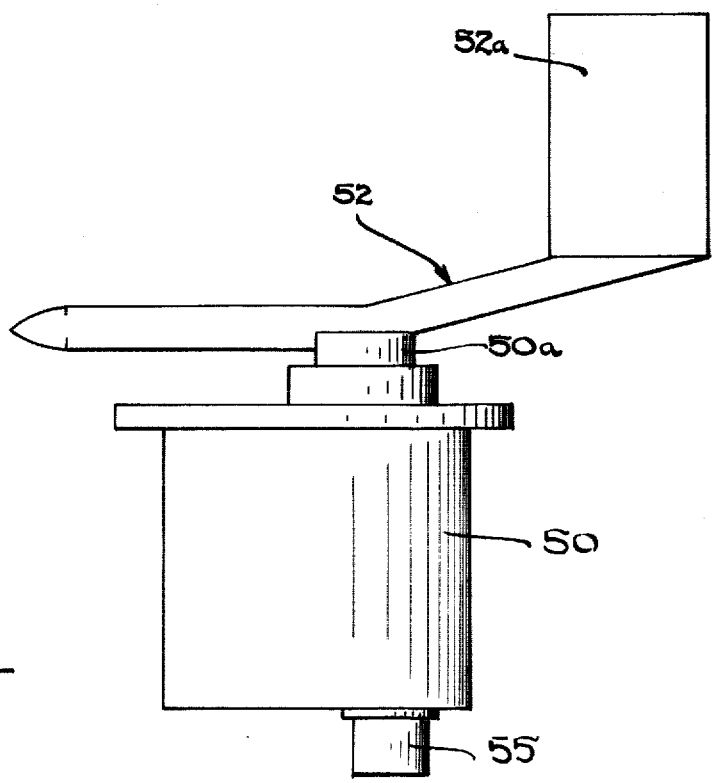
FIG. 3 is a side elevational view of the angle of attack transducer of FIG. 2.

Referring now to FIGS. 2 and 3, an angle of attack vane and encoding transducer which may be employed in the system of the invention are illustrated. Attached to the shaft 50a of encoding transducer 50 is vane member 52. Encoding transducer 50 may be a commercially available type, such as the aforementioned Model No. OADC-23/4/BCDQ(200)L fabricated by Vernitech. Vane 52 has a tail portion 52a which is mounted in a proper position (usually along the fuselage of the aircraft) such that the vane is positioned in accordance with the angle of attack of the aircraft. The digitally encoded signals are taken from the transducer through connector 55 and fed to Schmitt trigger circuits 20a–20j as shown in FIG. 1.

Thus, a unique system and technique are provided for detecting errors in digital signals coded in unit distance codes.

While the invention has been described and illustrated in detail, it is to be clearly understood that this is by way of illustration and example only and is not to be taken by way of limitation, the spirit and scope of this invention being limited only by terms of the following claims.

TABLE 1

COMPLETE UNIT DISTANCE TABLE

| | | | | | | | |
|---|---|---|---|---|---|---|---|
| 0000000000 | 0000000001 | 0000000011 | 0000000010 | 0000000110 | 0000000111 | 0000000101 | 0000000100 |
| 0000001000 | 0000001001 | 0000001011 | 0000001010 | 0000001110 | 0000001111 | 0000001101 | 0000001100 |
| 0000011000 | 0000011001 | 0000011011 | 0000011010 | 0000011110 | 0000011111 | 0000011101 | 0000011100 |
| 0000010000 | 0000010001 | 0000010011 | 0000010010 | 0000010110 | 0000010111 | 0000010101 | 0000010100 |
| 0000110000 | 0000110001 | 0000110011 | 0000110010 | 0000110110 | 0000110111 | 0000110101 | 0000110100 |
| 0000111000 | 0000111001 | 0000111011 | 0000111010 | 0000111110 | 0000111111 | 0000111101 | 0000111100 |
| 0000101000 | 0000101001 | 0000101011 | 0000101010 | 0000101110 | 0000101111 | 0000101101 | 0000101100 |
| 0000100000 | 0000100001 | 0000100011 | 0000100010 | 0000100110 | 0000100111 | 0000100101 | 0000100100 |
| 0001100000 | 0001100001 | 0001100011 | 0001100010 | 0001100110 | 0001100111 | 0001100101 | 0001100100 |
| 0001101000 | 0001101001 | 0001101011 | 0001101010 | 0001101110 | 0001101111 | 0001101101 | 0001101100 |
| 0001111000 | 0001111001 | 0001111011 | 0001111010 | 0001111110 | 0001111111 | 0001111101 | 1100010100 |
| 0001110000 | 0001110001 | 0001110011 | 0001110010 | 0001110110 | 0001110111 | 0001110101 | 0001110100 |
| 0001010000 | 0001010001 | 0001010011 | 0001010010 | 0001010110 | 0001010111 | 0001010101 | 0001010100 |
| 0001011000 | 0001011001 | 0001011011 | 0001011010 | 0001011110 | 0001011111 | 0001011101 | 0001011100 |
| 0001001000 | 0001001001 | 0001001011 | 0001001010 | 0001001110 | 0001001111 | 0001001101 | 0001001100 |
| 0001000000 | 0001000001 | 0001000011 | 0001000010 | 0001000110 | 0001000111 | 0001000101 | 0001000100 |
| 0011000000 | 0011000001 | 0011000011 | 0011000010 | 0011000110 | 0011000111 | 0011000101 | 0011000100 |
| 0011001000 | 0011001001 | 0011001011 | 0011001010 | 0011001110 | 0011001111 | 0011001101 | 0011001100 |
| 0011011000 | 0011011001 | 0011011011 | 0011011010 | 0011011110 | 0011011111 | 0011011101 | 0011011100 |
| 0011010000 | 0011010001 | 0011010011 | 0011010010 | 0011010110 | 0011010111 | 0011010101 | 0011010100 |
| 0011110000 | 0011110001 | 0011110011 | 0011110010 | 0011110110 | 0011110111 | 0011110101 | 0011110100 |
| 0011111000 | 0011111001 | 0011111011 | 0011111010 | 0011111110 | 0011111111 | 0011111101 | 0011111100 |
| 0011101000 | 0011101001 | 0011101011 | 0011101010 | 0011101110 | 0011101111 | 0011101101 | 0011101100 |
| 0011100000 | 0011100001 | 0011100011 | 0011100010 | 0011100110 | 0011100111 | 0011100101 | 0011100100 |
| 0010100000 | 0010100001 | 0010100011 | 0010100010 | 0010100110 | 0010100111 | 0010100101 | 0010100100 |
| 0010101000 | 0010101001 | 0010101011 | 0010101010 | 0010101110 | 0010101111 | 0010101101 | 0010101100 |
| 0010111000 | 0010111001 | 0010111011 | 0010111010 | 0010111110 | 0010111111 | 0010111101 | 0010111100 |
| 0010110000 | 0010110001 | 0010110011 | 0010110010 | 0010110110 | 0010110111 | 0010110101 | 0010110100 |
| 0010010000 | 0010010001 | 0010010011 | 0010010010 | 0010010110 | 0010010111 | 0010010101 | 0010010100 |
| 0010011000 | 0010011001 | 0010011011 | 0010011010 | 0010011110 | 0010011111 | 0010011101 | 0010011100 |
| 0010001000 | 0010001001 | 0010001011 | 0010001010 | 0010001110 | 0010001111 | 0010001101 | 0010001100 |

TABLE 1-continued
COMPLETE UNIT DISTANCE TABLE

| | | | | | | | |
|---|---|---|---|---|---|---|---|
| 0010000000 | 0010000001 | 0010000011 | 0010000010 | 0010000110 | 0010000111 | 0010000101 | 0010000100 |
| 0110000000 | 0110000001 | 0110000011 | 0110000010 | 0110000110 | 0110000111 | 0110000101 | 0110000100 |
| 0110001000 | 0110001001 | 0110001011 | 0110001010 | 0110001110 | 0110001111 | 0110001101 | 0110001100 |
| 0110011000 | 0110011001 | 0110011011 | 0110011010 | 0110011110 | 0110011111 | 0110011101 | 0110011100 |
| 0110010000 | 0110010001 | 0110010011 | 0110010010 | 0110010110 | 0110010111 | 0110010101 | 0110010100 |
| 0110110000 | 0110110001 | 0110110011 | 0110110010 | 0110110110 | 0110110111 | 0110110101 | 0110110100 |
| 0110111000 | 0110111001 | 0110111011 | 0110111010 | 0110111110 | 0110111111 | 0110111101 | 0110111100 |
| 0110101000 | 0110101001 | 0110101011 | 0110101010 | 0110101110 | 0110101111 | 0110101101 | 0110101100 |
| | | | | | | | |
| 0110100000 | 0110100001 | 0110100011 | 0110100010 | 0110100110 | 0110100111 | 0110100101 | 0110100100 |
| 0111100000 | 0111100001 | 0111100011 | 0111100010 | 0111100110 | 0111100111 | 0111100101 | 0111100100 |
| 0111101000 | 0111101001 | 0111101011 | 0111101010 | 0111101110 | 0111101111 | 0111101101 | 0111101100 |
| 0111111000 | 0111111001 | 0111111011 | 0111111010 | 0111111110 | 0111111111 | 0111111101 | 0111111100 |
| 0111110000 | 0111110001 | 0111110011 | 0111110010 | 0111110110 | 0111110111 | 0111110101 | 0111110100 |
| 0111010000 | 0111010001 | 0111010011 | 0111010010 | 0111010110 | 0111010111 | 0111010101 | 0111010100 |
| 0111011000 | 0111011001 | 0111011011 | 0111011010 | 0111011110 | 0111011111 | 0111011101 | 0111011100 |
| 0111001000 | 0111001001 | 0111001011 | 0111001010 | 0111001110 | 0111001111 | 0111001101 | 0111001100 |
| | | | | | | | |
| 0111000000 | 0111000001 | 0111000011 | 0111000010 | 0111000110 | 0111000111 | 0111000101 | 0111000100 |
| 0101000000 | 0101000001 | 0101000011 | 0101000010 | 0101000110 | 0101000111 | 0101000101 | 0101000100 |
| 0101001000 | 0101001001 | 0101001011 | 0101001010 | 0101001110 | 0101001111 | 0101001101 | 0101001100 |
| 0101011000 | 0101011001 | 0101011011 | 0101011010 | 0101011110 | 0101011111 | 0101011101 | 0101011100 |
| 0101010000 | 0101010001 | 0101010011 | 0101010010 | 0101010110 | 0101010111 | 0101010101 | 0101010100 |
| 0101110000 | 0101110001 | 0101110011 | 0101110010 | 0101110110 | 0101110111 | 0101110101 | 0101110100 |
| 0101111000 | 0101111001 | 0101111011 | 0101111010 | 0101111110 | 0101111111 | 0101111101 | 0101111100 |
| 0101101000 | 0101101001 | 0101101011 | 0101101010 | 0101101110 | 0101101111 | 0101101101 | 0101101100 |
| | | | | | | | |
| 0101100000 | 0101100001 | 0101100011 | 0101100010 | 0101100110 | 0101100111 | 0101100101 | 0101100100 |
| 0100100000 | 0100100001 | 0100100011 | 0100100010 | 0100100110 | 0100100111 | 0100100101 | 0100100100 |
| 0100101000 | 0100101001 | 0100101011 | 0100101010 | 0100101110 | 0100101111 | 0100101101 | 0100101100 |
| 0100111000 | 0100111001 | 0100111011 | 0100111010 | 0100111110 | 0100111111 | 0100111101 | 0100111100 |
| 0100110000 | 0100110001 | 0100110011 | 0100110010 | 0100110110 | 0100110111 | 0100110101 | 0100110100 |
| 0100010000 | 0100010001 | 0100010011 | 0100010010 | 0100010110 | 0100010111 | 0100010101 | 0100010100 |
| 0100011000 | 0100011001 | 0100011011 | 0100011010 | 0100011110 | 0100011111 | 0100011101 | 0100011100 |
| 0100001000 | 0100001001 | 0100001011 | 0100001010 | *0100001110* | 0100001111 | 0100001101 | 0100001100 |
| | | | | | | | |
| 0100000000 | 0100000001 | 0100000011 | 0100000010 | 0100000110 | 0100000111 | 0100000101 | 0100000100 |
| 1100000000 | 1100000001 | 1100000011 | 1100000010 | 1100000110 | 1100000111 | 1100000101 | 1100000100 |
| 1100001000 | 1100001001 | 1100001011 | 1100001010 | 1100001110 | 1100001111 | 1100001101 | 1100001100 |
| 1100011000 | 1100011001 | 1100011011 | 1100011010 | 1100011110 | 1100011111 | 1100011101 | 1100011100 |
| 1100010000 | 1100010001 | 1100010011 | 1100010010 | 1100010110 | 1100010111 | 1100010101 | 1100010100 |
| 1100110000 | 1100110001 | 1100110011 | 1100110010 | 1100110110 | 1100110111 | 1100110101 | 1100110100 |
| 1100111000 | 1100111001 | 1100111011 | 1100111010 | 1100111110 | 1100111111 | 1100111101 | 1100111100 |
| 1100101000 | 1100101001 | 1100101011 | 1100101010 | 1100101110 | 1100101111 | 1100101101 | 1100101100 |
| | | | | | | | |
| 1100100000 | 1100100001 | 1100100011 | 1100100010 | 1100100110 | 1100100111 | 1100100101 | 1100100100 |
| 1101100000 | 1101100001 | 1101100011 | 1101100010 | 1101100110 | 1101100111 | 1101100101 | 1101100100 |
| 1101101000 | 1101101001 | 1101101011 | 1101101010 | 1101101110 | 1101101111 | 1101101101 | 1101101100 |
| 1101111000 | 1101111001 | 1101111011 | 1101111010 | 1101111110 | 1101111111 | 1101111101 | 1101111100 |
| 1101110000 | 1101110001 | 1101110011 | 1101110010 | 1101110110 | 1101110111 | 1101110101 | 1101110100 |
| 1101010000 | 1101010001 | 1101010011 | 1101010010 | 1101010110 | 1101010111 | 1101010101 | 1101010100 |
| 1101011000 | 1101011001 | 1101011011 | 1101011010 | 1101011110 | 1101011111 | 1101011101 | 1101011100 |
| 1101001000 | 1101001001 | 1101001011 | 1101001010 | 1101001110 | 1101001111 | 1101001101 | 1101001100 |
| | | | | | | | |
| 1101000000 | 1101000001 | 1101000011 | 1101000010 | 1101000110 | 1101000111 | 1101000101 | 1101000100 |
| 1111000000 | 1111000001 | 1111000011 | 1111000010 | 1111000110 | 1111000111 | 1111000101 | 1111000100 |
| 1111001000 | 1111001001 | 1111001011 | 1111001010 | 1111001110 | 1111001111 | 1111001101 | 1111001100 |
| 1111011000 | 1111011001 | 1111011011 | 1111011010 | 1111011110 | 1111011111 | 1111011101 | 1111011100 |
| 1111010000 | 1111010001 | 1111010011 | 1111010010 | 1111010110 | 1111010111 | 1111010101 | 1111010100 |
| 1111110000 | 1111110001 | 1111110011 | 1111110010 | 1111110110 | 1111110111 | 1111110101 | 1111110100 |
| 1111111000 | 1111111001 | 1111111011 | 1111111010 | 1111111110 | 1111111111 | 1111111101 | 1111111100 |
| 1111101000 | 1111101001 | 1111101011 | 1111101010 | 1111101110 | 1111101111 | 1111101101 | 1111101100 |
| | | | | | | | |
| 1111100000 | 1111100001 | 1111100011 | 1111100010 | 1111100110 | 1111100111 | 1111100101 | 1111100100 |
| 1110100000 | 1110100001 | 1110100011 | 1110100010 | 1110100110 | 1110100111 | 1110100101 | 1110100100 |
| 1110101000 | 1110101001 | 1110101011 | 1110101010 | 1110101110 | 1110101111 | 1110101101 | 1110101100 |
| 1110111000 | 1110111001 | 1110111011 | 1110111010 | 1110111110 | 1110111111 | 1110111101 | 1110111100 |
| 1110110000 | 1110110001 | 1110110011 | 1110110010 | 1110110110 | 1110110111 | 1110110101 | 1110110100 |
| 1110010000 | 1110010001 | 1110010011 | 1110010010 | 1110010110 | 1110010111 | 1110010101 | 1110010100 |
| 1110011000 | 1110011001 | 1110011011 | 1110011010 | 1110011110 | 1110011111 | 1110011101 | 1110011100 |
| 1110001000 | 1110001001 | 1110001011 | 1110001010 | 1110001110 | 1110001111 | 1110001101 | 1110001100 |
| | | | | | | | |
| 1110000000 | 1110000001 | 1110000011 | 1110000010 | 1110000110 | 1110000111 | 1110000101 | 1110000100 |
| 1010000000 | 1010000001 | 1010000011 | 1010000010 | 1010000110 | 1010000111 | 1010000101 | 1010000100 |
| 1010001000 | 1010001001 | 1010001011 | 1010001010 | 1010001110 | 1010001111 | 1010001101 | 1010001100 |
| 1010011000 | 1010011001 | 1010011011 | 1010011010 | 1010011110 | 1010011111 | 1010011101 | 1010011100 |
| 1010010000 | 1010010001 | 1010010011 | 1010010010 | 1010010110 | 1010010111 | 1010010101 | 1010010100 |
| 1010110000 | 1010110001 | 1010110011 | 1010110010 | 1010110110 | 1010110111 | 1010110101 | 1010110100 |
| 1010111000 | 1010111001 | 1010111011 | 1010111010 | 1010111110 | 1010111111 | 1010111101 | 1010111100 |
| 1010101000 | 1010101001 | 1010101011 | 1010101010 | 1010101110 | 1010101111 | 1010101101 | 1010101100 |

TABLE 1-continued
COMPLETE UNIT DISTANCE TABLE

| | | | | | | | |
|---|---|---|---|---|---|---|---|
| 1010100000 | 1010100001 | 1010100011 | 1010100010 | 1010100110 | 1010100111 | 1010100101 | 1010100100 |
| 1011100000 | 1011100001 | 1011100011 | 1011100010 | 1011100110 | 1011100111 | 1011100101 | 1011100100 |
| 1011101000 | 1011101001 | 1011101011 | 1011101010 | 1011101110 | 1011101111 | 1011101101 | 1011101100 |
| 1011111000 | 1011111001 | 1011111011 | 1011111010 | 1011111110 | 1011111111 | 1011111101 | 1011111100 |
| 1011110000 | 1011110001 | 1011110011 | 1011110010 | 1011110110 | 1011110111 | 1011110101 | 1011110100 |
| 1011010000 | 1011010001 | 1011010011 | 1011010010 | 1011010110 | 1011010111 | 1011010101 | 1011010100 |
| 1011011000 | 1011011001 | 1011011011 | 1011011010 | 1011011110 | 1011011111 | 1011011101 | 1011011100 |
| 1011001000 | 1011001001 | 1011001011 | 1011001010 | 1011001110 | 1011001111 | 1011001101 | 1011001100 |
| 1011000000 | 1011000001 | 1011000011 | 1011000010 | 1011000110 | 1011000111 | 1011000101 | 1011000100 |
| 1001000000 | 1001000001 | 1001000011 | 1001000010 | 1001000110 | 1001000111 | 1001000101 | 1001000100 |
| 1001001000 | 1001001001 | 1001001011 | 1001001010 | 1001001110 | 1001001111 | 1001001101 | 1001001100 |
| 1001011000 | 1001011001 | 1001011011 | 1001011010 | 1001011110 | 1001011111 | 1001011101 | 1001011100 |
| 1001010000 | 1001010001 | 1001010011 | 1001010010 | 1001010110 | 1001010111 | 1001010101 | 1001010100 |
| 1001110000 | 1001110001 | 1001110011 | 1001110010 | 1001110110 | 1001110111 | 1001110101 | 1001110100 |
| 1001111000 | 1001111001 | 1001111011 | 1001111010 | 1001111110 | 1001111111 | 1001111101 | 1001111100 |
| 1001101000 | 1001101001 | 1001101011 | 1001101010 | 1001101110 | 1001101111 | 1001101101 | 1001101100 |
| 1001100000 | 1001100001 | 1001100011 | 1001100010 | 1001100110 | 1001100111 | 1001100101 | 1001100100 |
| 1000100000 | 1000100001 | 1000100011 | 1000100010 | 1000100110 | 1000100111 | 1000100101 | 1000100100 |
| 1000101000 | 1000101001 | 1000101011 | 1000101010 | 1000101110 | 1000101111 | 1000101101 | 1000101100 |
| 1000111000 | 1000111001 | 1000111011 | 1000111010 | 1000111110 | 1000111111 | 1000111101 | 1000111100 |
| 1000110000 | 1000110001 | 1000110011 | 1000110010 | 1000110110 | 1000110111 | 1000110101 | 1000110100 |
| 1000010000 | 1000010001 | 1000010011 | 1000010010 | 1000010110 | 1000010111 | 1000010101 | 1000010100 |
| 1000011000 | 1000011001 | 1000011011 | 1000011010 | 1000011110 | 1000011111 | 1000011101 | 1000011100 |
| 1000001000 | 1000001001 | 1000001011 | 1000001010 | 1000001110 | 1000001111 | 1000001101 | 1000001100 |
| 1000000000 | 1000000001 | 1000000011 | 1000000010 | 1000000110 | 1000000111 | 1000000101 | 1000000100 |

TABLE 2
CODE TABLE (601 words)

| | | | | | | |
|---|---|---|---|---|---|---|
| 0 | 0000000001 | 0000000011 | 0000000010 | 0000000110 | 0000000111 | |
| 5 | 0000000101 | 0000000100 | 0000001100 | 0000001101 | 0000001111 | |
| 10 | 0000001110 | 0000001010 | 0000001011 | 0000001001 | 0000001000 | |
| 15 | 0000011000 | 0000011001 | 0000011011 | 0000011010 | 0000011110 | |
| 20 | 0000011111 | 0000011101 | 0000011100 | 0000010100 | 0000010101 | |
| 25 | 0000010111 | 0000010110 | 0000010010 | 0000010011 | 0000010001 | |
| 30 | 0000010000 | 0000110000 | 0000110001 | 0000110011 | 0000110010 | |
| 35 | 0000110110 | 0000110111 | 0000110101 | 0000110100 | 0000111100 | |
| 40 | 0000101100 | 0000101101 | 0000101111 | 0000101110 | 0000101010 | |
| 45 | 0000101011 | 0000101001 | 0000101000 | 0000100000 | 0001100000 | |
| 50 | 0001100001 | 0001100011 | 0001100010 | 0001100110 | 0001100111 | |
| 55 | 0001100101 | 0001100100 | 0001101100 | 0001111100 | 0001111101 | |
| 60 | 0001111111 | 0001111110 | 0001111010 | 0001111011 | 0001111001 | |
| 65 | 0001111000 | 0001110000 | 0001010000 | 0001010001 | 0001010011 | |
| 70 | 0001010010 | 0001010110 | 0001010111 | 0001010101 | 0001010100 | |
| 75 | 0001011100 | 0001001100 | 0001001101 | 0001001111 | 0001001110 | |
| 80 | 0001001010 | 0001001011 | 0001001001 | 0001001000 | 0001000000 | |
| 85 | 0011000000 | 0011000001 | 0011000011 | 0011000010 | 0011000110 | |
| 90 | 0011000111 | 0011000101 | 0011000100 | 0011001100 | 0011011100 | |
| 95 | 0011011101 | 0011011111 | 0011011110 | 0011011010 | 0011011011 | |
| 100 | 0011011001 | 0011011000 | 0011010000 | 0011110000 | 0011110001 | |
| 105 | 0011110011 | 0011110010 | 0011110110 | 0011110111 | 0011110101 | |
| 110 | 0011110100 | 0011111100 | 0011101100 | 0011101101 | 0011101111 | |
| 115 | 0011101110 | 0011101010 | 0011101011 | 0011101001 | 0011101000 | |
| 120 | 0011100000 | 0010100000 | 0010100001 | 0010100011 | 0010100010 | |
| 125 | 0010100110 | 0010100111 | 0010100101 | 0010100100 | 0010101100 | |
| 130 | 0010111100 | 0010111101 | 0010111111 | 0010111110 | 0010111010 | |
| 135 | 0010111011 | 0010111001 | 0010111000 | 0010110000 | 0010010000 | |
| 140 | 0010010001 | 0010010011 | 0010010010 | 0010010110 | 0010010111 | |
| 145 | 0010010101 | 0010010100 | 0010011100 | 0010001100 | 0010001101 | |
| 150 | 0010001111 | 0010001110 | 0010001010 | 0010001011 | 0010001001 | |
| 155 | 0010001000 | 0010000000 | 0110000000 | 0110000001 | 0110000011 | |
| 160 | 0110000010 | 0110000110 | 0110000111 | 0110000101 | 0110000100 | |
| 165 | 0110001100 | 0110011100 | 0110011101 | 0110011111 | 0110011110 | |
| 170 | 0110011010 | 0110011011 | 0110011001 | 0110011000 | 0110010000 | |
| 175 | 0110110000 | 0110110001 | 0110110011 | 0110110010 | 0110110110 | |
| 180 | 0110110111 | 0110110101 | 0110110100 | 0110111100 | 0110101100 | |
| 185 | 0110101101 | 0110101111 | 0110101110 | 0110101010 | 0110101011 | |
| 190 | 0110101001 | 0110101000 | 0110100000 | 0111100000 | 0111100001 | |
| 195 | 0111100011 | 0111100010 | 0111100110 | 0111100111 | 0111100101 | |
| 200 | 0111100100 | 0111101100 | 0111111100 | 0111111101 | 0111111111 | |
| 205 | 0111111110 | 0111111010 | 0111111011 | 0111111001 | 0111111000 | |
| 210 | 0111110000 | 0111010000 | 0111010001 | 0111010011 | 0111010010 | |
| 215 | 0111010110 | 0111010111 | 0111010101 | 0111010100 | 0111011100 | |
| 220 | 0111001100 | 0111001101 | 0111001111 | 0111001110 | 0111001010 | |
| 225 | 0111001011 | 0111001001 | 0111001000 | 0111000000 | 0101000000 | |

TABLE 2-continued
CODE TABLE (601 words)

| | | | | | |
|---|---|---|---|---|---|
| 230 | 0101000001 | 0101000011 | 0101000010 | 0101000110 | 0101000111 |
| 235 | 0101000101 | 0101000100 | 0101001100 | 0101011100 | 0101011101 |
| 240 | 0101011111 | 0101011110 | 0101011010 | 0101011011 | 0101011001 |
| 245 | 0101011000 | 0101010000 | 0101110000 | 0101110001 | 0101110011 |
| 250 | 0101110010 | 0101110110 | 0101110111 | 0101110101 | 0101110100 |
| 255 | 0101111100 | 0101101100 | 0101101101 | 0101101111 | 0101101110 |
| 260 | 0101101010 | 0101101011 | 0101101001 | 0101101000 | 0101100000 |
| 265 | 0100100000 | 0100100001 | 0100100011 | 0100100010 | 0100100110 |
| 270 | 0100100111 | 0100100101 | 0100100100 | 0100101100 | 0100111100 |
| 275 | 0100111101 | 0100111111 | 0100111110 | 0100111010 | 0100111011 |
| 280 | 0100111001 | 0100111000 | 0100110000 | 0100010000 | 0100010001 |
| 285 | 0100010011 | 0100010010 | 0100010110 | 0100010111 | 0100010101 |
| 290 | 0100010100 | 0100011100 | 0100001100 | 0100001101 | 0100001111 |
| 295 | *0100001110* | 0100001010 | 0100001011 | 0100001001 | 0100001000 |
| 300 | 0100000000 | 1100000000 | 1100000001 | 1100000011 | 1100000010 |
| 305 | 1100000110 | 1100000111 | 1100000101 | 1100000100 | 1100001100 |
| 310 | 1100011100 | 1100011101 | 1100011111 | 1100011110 | 1100011010 |
| 315 | 1100011011 | 1100011001 | 1100011000 | 1100010000 | 1100110000 |
| 320 | 1100110001 | 1100110011 | 1100110010 | 1100110110 | 1100110111 |
| 325 | 1100110101 | 1100110100 | 1100111100 | 1100101100 | 1100101101 |
| 330 | 1100101111 | 1100101110 | 1100101010 | 1100101011 | 1100101001 |
| 335 | 1100101000 | 1100100000 | 1101100000 | 1101100001 | 1101100011 |
| 340 | 1101100010 | 1101100110 | 1101100111 | 1101100101 | 1101100100 |
| 345 | 1101101100 | 1101111100 | 1101111101 | 1101111111 | 1101111110 |
| 350 | 1101111010 | 1101111011 | 1101111001 | 1101111000 | 1101110000 |
| 355 | 1101010000 | 1101010001 | 1101010011 | 1101010010 | 1101010110 |
| 360 | 1101010111 | 1101010101 | 1101010100 | 1101011100 | 1101001100 |
| 365 | 1101001101 | 1101001111 | 1101001110 | 1101001010 | 1101001011 |
| 370 | 1101001001 | 1101001000 | 1101000000 | 1111000000 | 1111000001 |
| 375 | 1111000011 | 1111000010 | 1111000110 | 1111000111 | 1111000101 |
| 380 | 1111000100 | 1111001100 | 1111011100 | 1111011101 | 1111011111 |
| 385 | 1111011110 | 1111011010 | 1111011011 | 1111011001 | 1111011000 |
| 390 | 1111010000 | 1111110000 | 1111110001 | 1111110011 | 1111110010 |
| 395 | 1111110110 | 1111110111 | 1111110101 | 1111110100 | 1111111100 |
| 400 | 1111101100 | 1111101101 | 1111101111 | 1111101110 | 1111101010 |
| 405 | 1111101011 | 1111101001 | 1111101000 | 1111100000 | 1110100000 |
| 410 | 1110100001 | 1110100011 | 1110100010 | 1110100110 | 1110100111 |
| 415 | 1110100101 | 1110100100 | 1110101100 | 1110111100 | 1110111101 |
| 420 | 1110111111 | 1110111110 | 1110111010 | 1110111011 | 1110111001 |
| 425 | 1110111000 | 1110110000 | 1110010000 | 1110010001 | 1110010011 |
| 430 | 1110010010 | 1110010110 | 1110010111 | 1110010101 | 1110010100 |
| 435 | 1110011100 | 1110001100 | 1110001101 | 1110001111 | 1110001110 |
| 440 | 1110001010 | 1110001011 | 1110001001 | 1110001000 | 1110000000 |
| 445 | 1010000000 | 1010000001 | 1010000011 | 1010000010 | 1010000110 |
| 450 | 1010000111 | 1010000101 | 1010000100 | 1010001100 | 1010011100 |
| 455 | 1010011101 | 1010011111 | 1010011110 | 1010011010 | 1010011011 |
| 460 | 1010011001 | 1010011000 | 1010010000 | 1010110000 | 1010110001 |
| 465 | 1010110011 | 1010110010 | 1010110110 | 1010110111 | 1010110101 |
| 470 | 1010110100 | 1010111100 | 1010101100 | 1010101101 | 1010101111 |
| 475 | 1010101110 | 1010101010 | 1010101011 | 1010101001 | 1010101000 |
| 480 | 1010100000 | 1011100000 | 1011100001 | 1011100011 | 1011100010 |
| 485 | 1011100110 | 1011100111 | 1011100101 | 1011100100 | 1011101100 |
| 490 | 1011111100 | 1011111101 | 1011111111 | 1011111110 | 1011111010 |
| 495 | 1011111011 | 1011111001 | 1011110000 | 1011110000 | 1011010000 |
| 500 | 1011010001 | 1011010011 | 1011010010 | 1011010110 | 1011010111 |
| 505 | 1011010101 | 1011010100 | 1011011100 | 1011001100 | 1011001101 |
| 510 | 1011001111 | 1011001110 | 1011001010 | 1011001011 | 1011001001 |
| 515 | 1011001000 | 1011000000 | 1001000000 | 1001000001 | 1001000011 |
| 520 | 1001000010 | 1001000110 | 1001000111 | 1001000101 | 1001000100 |
| 525 | 1001001100 | 1001011100 | 1001011101 | 1001011111 | 1001011110 |
| 530 | 1001011010 | 1001011011 | 1001011001 | 1001011000 | 1001010000 |
| 535 | 1001110000 | 1001110001 | 1001110011 | 1001110010 | 1001110110 |
| 540 | 1001110111 | 1001110101 | 1001110100 | 1001111100 | 1001101100 |
| 545 | 1001101101 | 1001101111 | 1001101110 | 1001101010 | 1001101011 |
| 550 | 1001101001 | 1001101000 | 1001100000 | 1000100000 | 1000100001 |
| 555 | 1000100011 | 1000100010 | 1000100110 | 1000100111 | 1000100101 |
| 560 | 1000100100 | 1000101100 | 1000111100 | 1000111101 | 1000111111 |
| 565 | 1000111110 | 1000111010 | 1000111011 | 1000111001 | 1000111000 |
| 570 | 1000110000 | 1000010000 | 1000010001 | 1000010011 | 1000010010 |
| 575 | 1000010110 | 1000010111 | 1000010101 | 1000010100 | 1000011100 |
| 580 | 1000011101 | 1000011111 | 1000011110 | 1000011010 | 1000011011 |
| 585 | 1000011001 | 1000011000 | 1000001000 | 1000001001 | 1000001011 |
| 590 | 1000001010 | 1000001110 | 1000001111 | 1000001101 | 1000001100 |
| 595 | 1000000100 | 1000000101 | 1000000111 | 1000000110 | 1000000010 |
| 600 | 1000000011 | | | | |

I claim:

1. A system for detecting bit errors in a digital signal coded in a unit distance code employing "words" selected from a complete unit distance table comprising
   means for generating said coded signal, said coded signal having groups of "illegal" words of the complete unit distance table omitted in interspersed fashion between groups of "legal" words in said table which are used,
   a programmed ROM connected to receive the coded signal from said generating means, said ROM being programmed to generate a predetermined output signal whenever it is addressed by "illegal" words, and
   alerting means connected to said ROM to receive said predetermined output signal for generating an alerting signal in response thereto.

2. The system of claim 1 wherein the generating means comprises an angle of attack sensor.

3. The system of claim 2 wherein the output of said sensor is coded in unit distance code.

4. The system of claim 2 wherein said sensor comprises a light source, a bank of photo transistors and a coding disc apertured in accordance with said code positioned between said light source and said transistors, to pass light between said light source and said transistors when apertured disc portions are therebetween.

5. The system of claim 4 wherein said sensor includes a vane coupled to said disc to position the disc in accordance with its own position.

6. The system of claim 3 and further including a programmed ROM for converting the coded signal generated by said generating means to any other binary code.

7. The system of claim 1 wherein the groups of "illegal" words are interspersed between the groups of "legal" words in a predetermined pattern.

8. A method for detecting bit errors in a digital signal coded in a unit distance code employing "words" selected from a complete unit distance table comprising
   generating said coded signal, said signal having groups of "illegal" words in the complete unit distance table omitted in interspersed fashion between groups of "legal" words in the table which are used,
   programming an ROM to generate a predetermined output signal whenever it is addressed by an "illegal" word,
   feeding said coded signal to said ROM, and
   generating an alerting signal in response to said predetermined output signal from said ROM.

* * * * *